US011439049B2

(12) United States Patent
Li et al.

(10) Patent No.: US 11,439,049 B2
(45) Date of Patent: *Sep. 6, 2022

(54) FRAMES FOR ELECTROMAGNETIC INTERFERENCE (EMI) SHIELDING ASSEMBLIES INCLUDING DETACHABLE PICKUP MEMBERS

(71) Applicant: Laird Technologies, Inc., Chesterfield, MO (US)

(72) Inventors: Zhongliang Li, Shenzhen (CN); Youhong Li, Shenzhen (CN)

(73) Assignee: Laird Technologies, Inc., Chesterfield, MO (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/391,317

(22) Filed: Aug. 2, 2021

(65) Prior Publication Data

US 2022/0022347 A1 Jan. 20, 2022

Related U.S. Application Data

(63) Continuation of application No. 16/431,119, filed on Jun. 4, 2019, now Pat. No. 11,083,118.

(60) Provisional application No. 62/790,291, filed on Jan. 9, 2019.

(51) Int. Cl.
*H05K 9/00* (2006.01)

(52) U.S. Cl.
CPC ......... *H05K 9/0032* (2013.01); *H05K 9/0026* (2013.01)

(58) Field of Classification Search
CPC .......................... H05K 9/0032; H05K 9/0026
See application file for complete search history.

(56) References Cited

U.S. PATENT DOCUMENTS

| 5,495,399 | A | | 2/1996 | Gore et al. | |
|---|---|---|---|---|---|
| 5,742,004 | A | * | 4/1998 | Greco | H05K 9/0032 361/752 |
| 5,917,708 | A | * | 6/1999 | Moran | H05K 9/0032 174/382 |
| 7,488,902 | B2 | | 2/2009 | English et al. | |
| 11,083,118 | B2 | | 8/2021 | Li et al. | |
| 2002/0185294 | A1 | * | 12/2002 | Shlyakhtichman | H05K 9/0032 174/387 |
| 2008/0062668 | A1 | | 3/2008 | Kakinoki et al. | |
| 2013/0033843 | A1 | | 2/2013 | Crotty, Jr. | |
| 2014/0262473 | A1 | | 9/2014 | Robinson et al. | |
| 2016/0227679 | A1 | * | 8/2016 | English | H05K 9/0024 |
| 2017/0181336 | A1 | * | 6/2017 | Robinson | H05K 9/0032 |
| 2018/0263144 | A1 | | 9/2018 | Crotty, Jr. et al. | |

FOREIGN PATENT DOCUMENTS

| JP | 2007266024 A | 10/2007 |
|---|---|---|
| JP | 2008034713 A | 2/2008 |

* cited by examiner

*Primary Examiner* — Hung V Ngo
(74) *Attorney, Agent, or Firm* — Harness, Dickey & Pierce, P.L.C.; Anthony Fussner

(57) ABSTRACT

According to various aspects, exemplary embodiments are disclosed of frames for shielding assemblies including detachable or severable pickup members. Also disclosed are exemplary embodiments of shielding assemblies (e.g., board level shields, etc.) including the same.

18 Claims, 7 Drawing Sheets

FRAMES FOR ELECTROMAGNETIC INTERFERENCE (EMI) SHIELDING ASSEMBLIES INCLUDING DETACHABLE PICKUP MEMBERS

CROSS-REFERENCE TO RELATED APPLICATIONS

This application is a continuation of U.S. patent application Ser. No. 16/431,119 filed Jun. 4, 2019 (published as US2020/0221613 on Jun. 9, 2020 and issuing as U.S. Pat. No. 11,083,118 on Aug. 3, 2021). U.S. patent application Ser. No. 16/431,119 claims priority to and the benefit of U.S. Provisional Patent Application No. 62/790,291 filed Jan. 9, 2019. The entire disclosures of the above applications are incorporated herein by reference.

FIELD

The present disclosure generally relates to frames for EMI shielding assemblies including detachable or severable pickup members, and shielding assemblies (e.g., a board level shield (BLS), etc.) including the same.

BACKGROUND

This section provides background information related to the present disclosure which is not necessarily prior art.

A common problem in the operation of electronic devices is the generation of electromagnetic radiation within the electronic circuitry of the equipment. Such radiation may result in electromagnetic interference (EMI) or radio frequency interference (RFI), which can interfere with the operation of other electronic devices within a certain proximity. Without adequate shielding, EMI/RFI interference may cause degradation or complete loss of important signals, thereby rendering the electronic equipment inefficient or inoperable.

A common solution to ameliorate the effects of EMI/RFI is through the use of shields capable of absorbing and/or reflecting and/or redirecting EMI energy. These shields are typically employed to localize EMI/RFI within its source, and to insulate other devices proximal to the EMI/RFI source. For example, board level shields are widely used to protect sensitive electronic devices against inter and intra system electromagnetic interferences and reduce unwanted electromagnetic radiations from a noisy integrated circuit (IC).

The term "EMI" as used herein should be considered to generally include and refer to EMI emissions and RFI emissions, and the term "electromagnetic" should be considered to generally include and refer to electromagnetic and radio frequency from external sources and internal sources. Accordingly, the term shielding (as used herein) broadly includes and refers to mitigating (or limiting) EMI and/or RFI, such as by absorbing, reflecting, blocking, and/or redirecting the energy or some combination thereof so that it no longer interferes, for example, for government compliance and/or for internal functionality of the electronic component system.

DRAWINGS

The drawings described herein are for illustrative purposes only of selected embodiments and not all possible implementations, and are not intended to limit the scope of the present disclosure.

FIGS. 1 and 2 are perspective views of a frame or fence of a board level shield (BLS) that includes a pick and place bridge (broadly, a pickup member) having double V-cut connections or attachments to the frame according to exemplary embodiments.

FIGS. 3, 4, and 5 are respective top, bottom, and side views of the BLS frame shown in FIG. 1.

Corresponding reference numerals indicate corresponding (although not necessarily identical) parts throughout the several views of the drawings.

DETAILED DESCRIPTION

Figure 1:
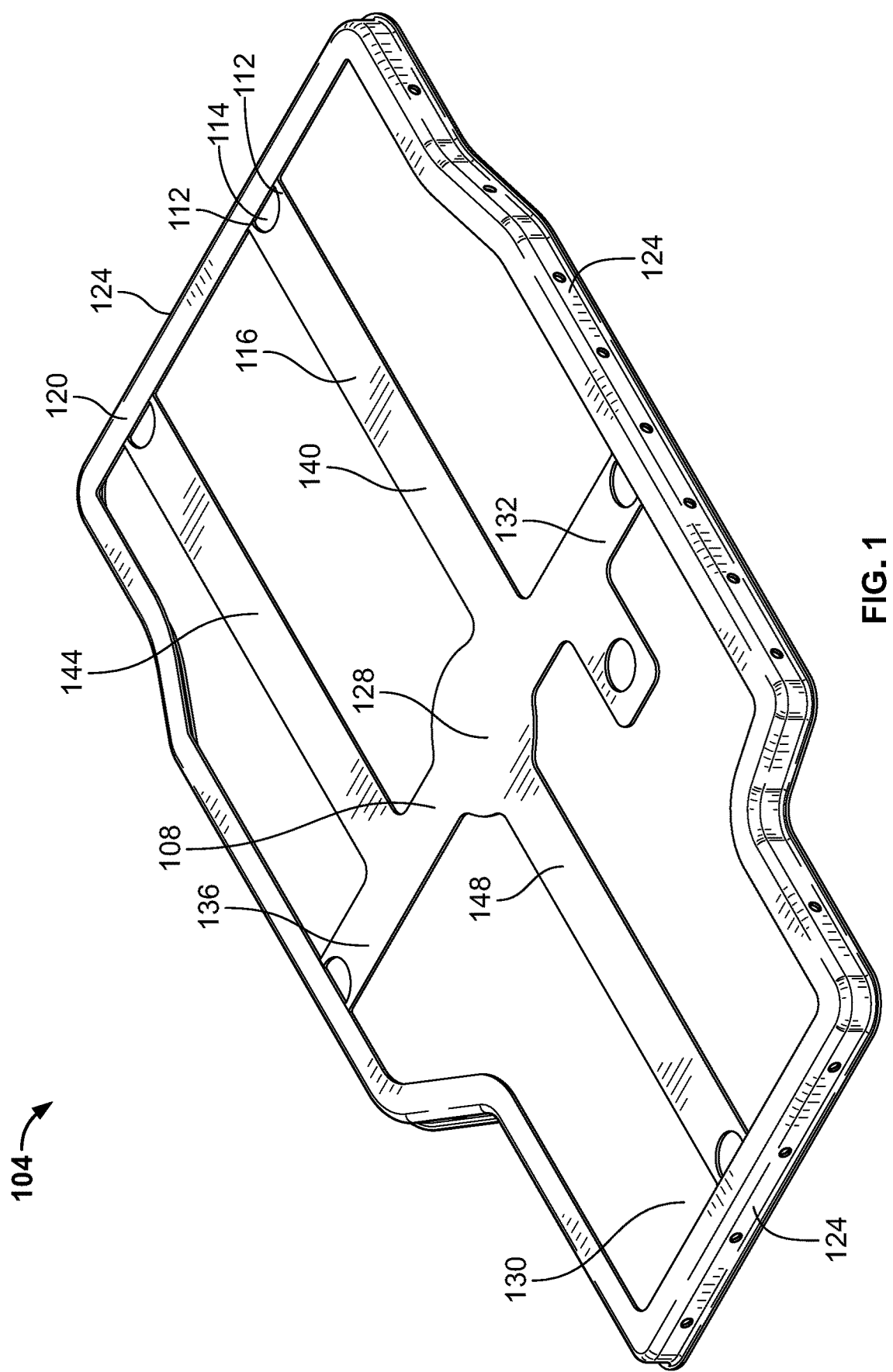
Figure 2:
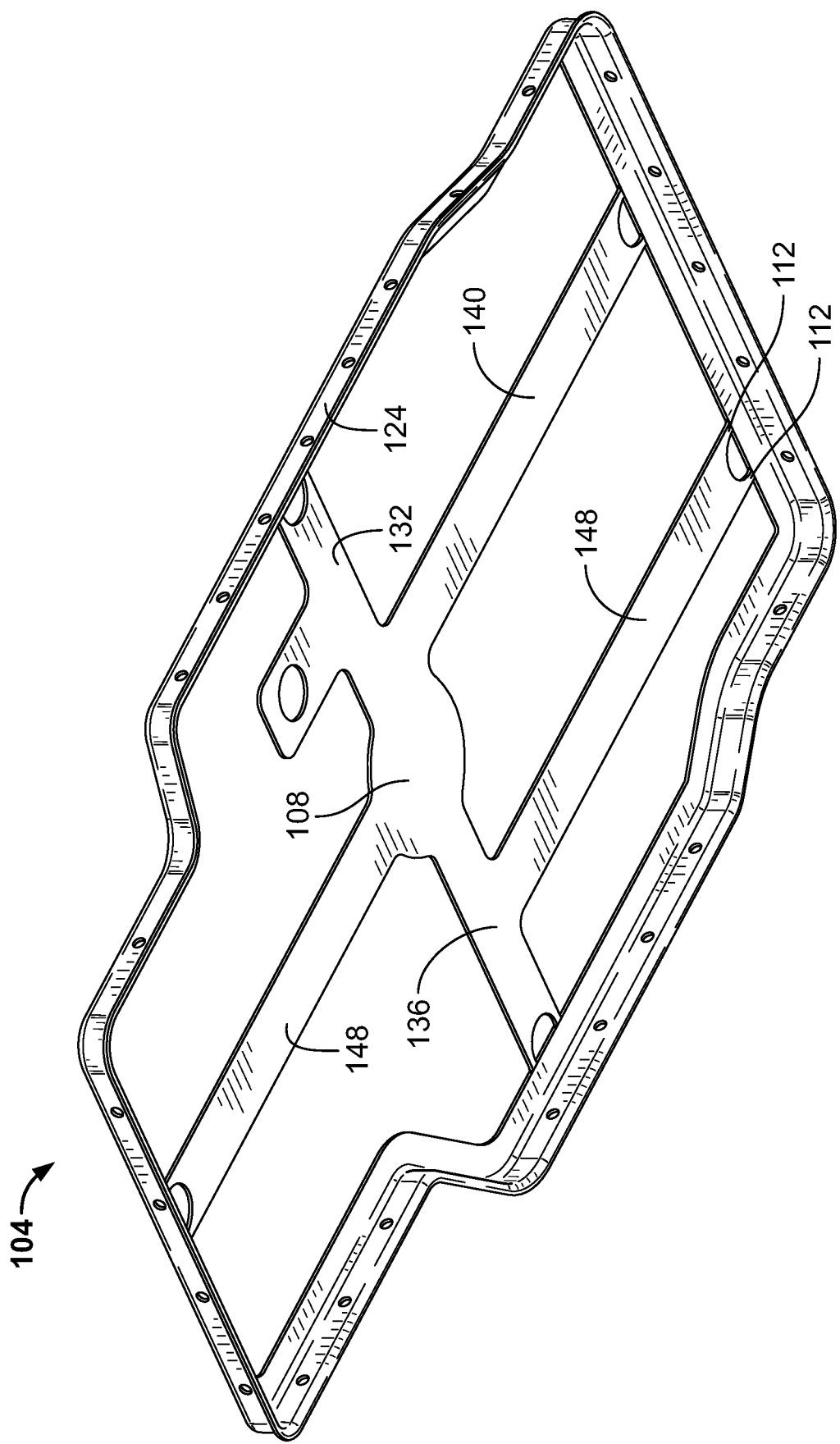
Figure 3:
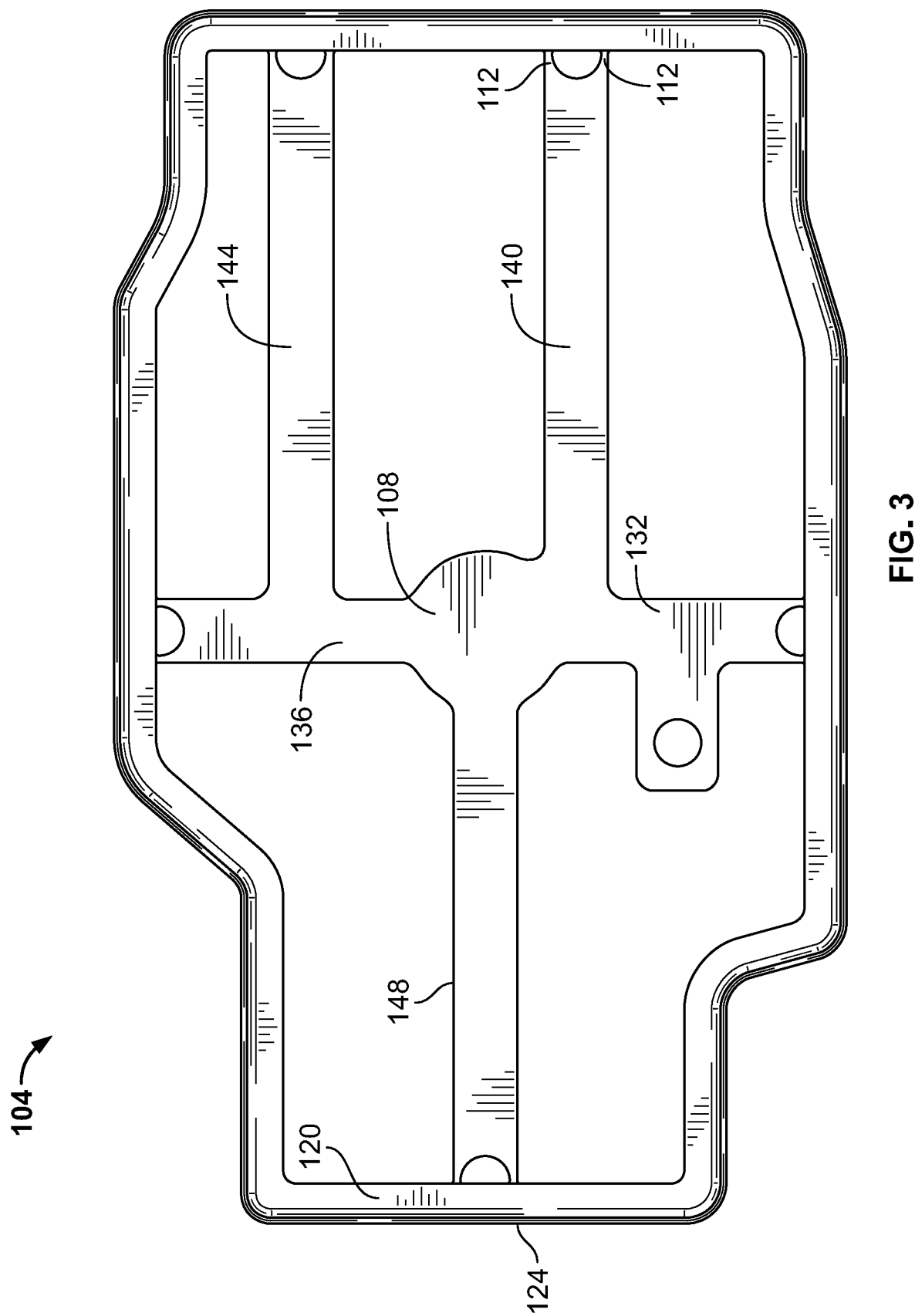
Figure 4:
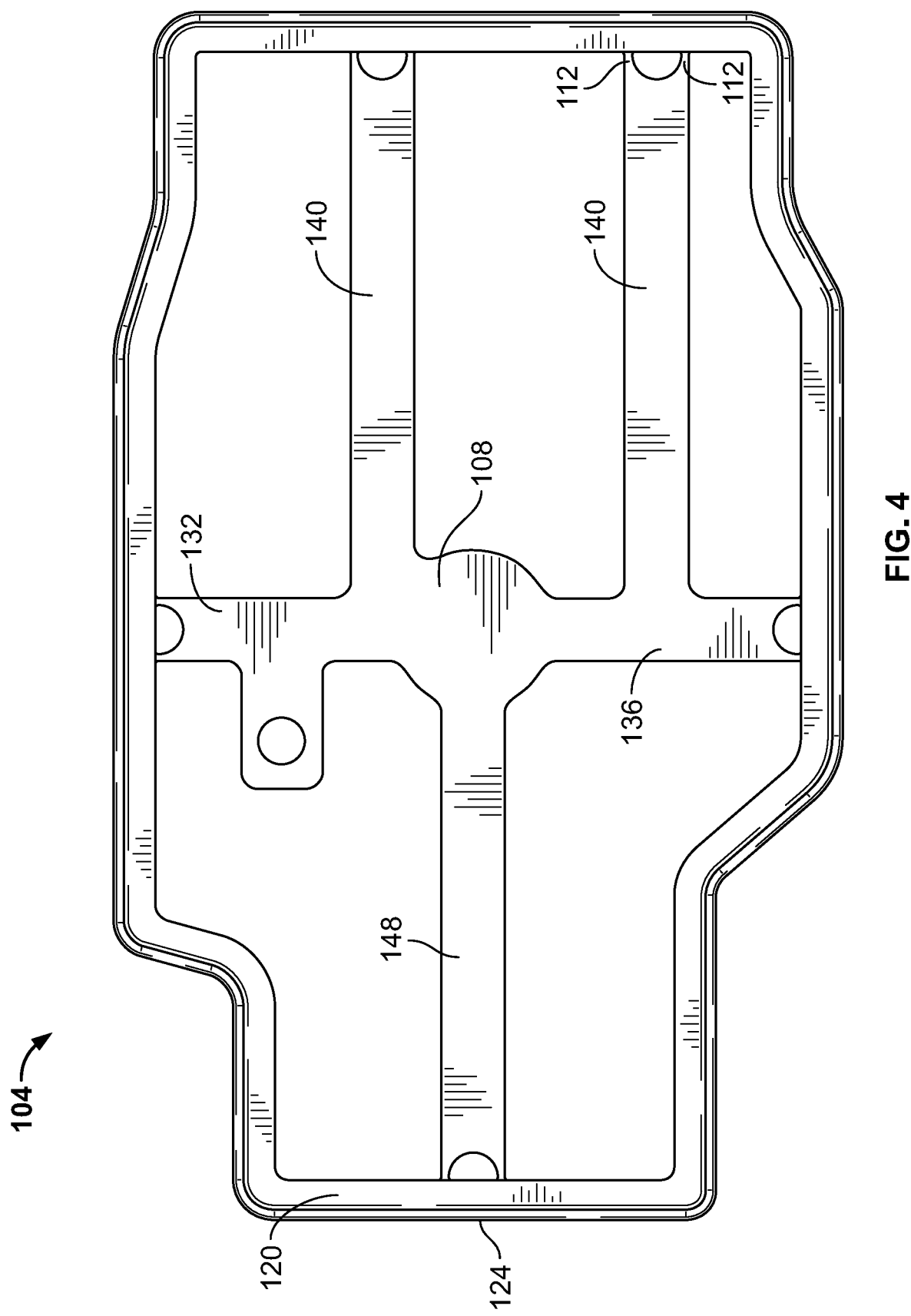
Figure 5:
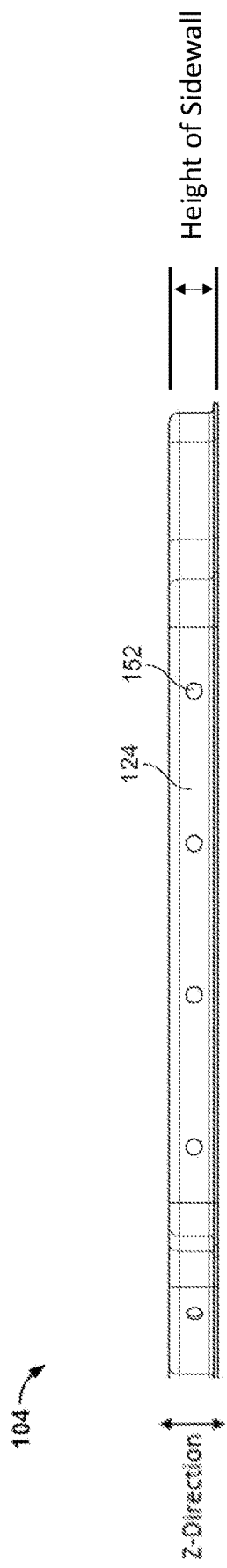

Example embodiments will now be described more fully with reference to the accompanying drawings.

Disclosed herein are exemplary embodiments of frames for EMI shielding assemblies including detachable or severable pickup members. Also disclosed are exemplary embodiments of shielding assemblies (e.g., board level shields, etc.) including the same.

As disclosed herein, a frame may include a pick and place bridge (broadly, a pickup member) having severable or detachable connections or attachments between the arms or legs (broadly, members) and a pick and place island (broadly, a pickup area). The arms extend generally between the pickup area/island and corresponding portions along and/or adjacent sidewalls of the frame.

The attachments or connections between the arms and the frame portions may be configured (e.g., provided with double V cuts, etc.) to be readily and/or relatively easily severed (broadly, detached), to thereby allow the entire pick and place bridge (including the arms and the island) to be readily removed from the frame, e.g., after the frame has been installed (e.g., soldered, attached via surface mount technology (SMT), etc.) to a substrate. For example, in exemplary embodiments, each arm may be attached or connected to corresponding portions of the frame via at least two spaced-apart connections or attachments that are separated by an opening therebetween. The connections or attachments may include V-cuts to reduce material thickness as compared to an initial thickness of the material used to form the frame and the bridge.

With reference to the figures, FIGS. 1 through 5 illustrate an exemplary embodiment of a frame or fence 104 including a pick and place bridge 108 (broadly, a pickup member) embodying one or more aspects of the present disclosure. The bridge 108 includes a pick and place island 128 (broadly, a pickup area) and arms or legs 116 (broadly, members). A board level shield (BLS) may include the frame 104 and a cover or lid that is attachable to the frame 104.

Figure 6:
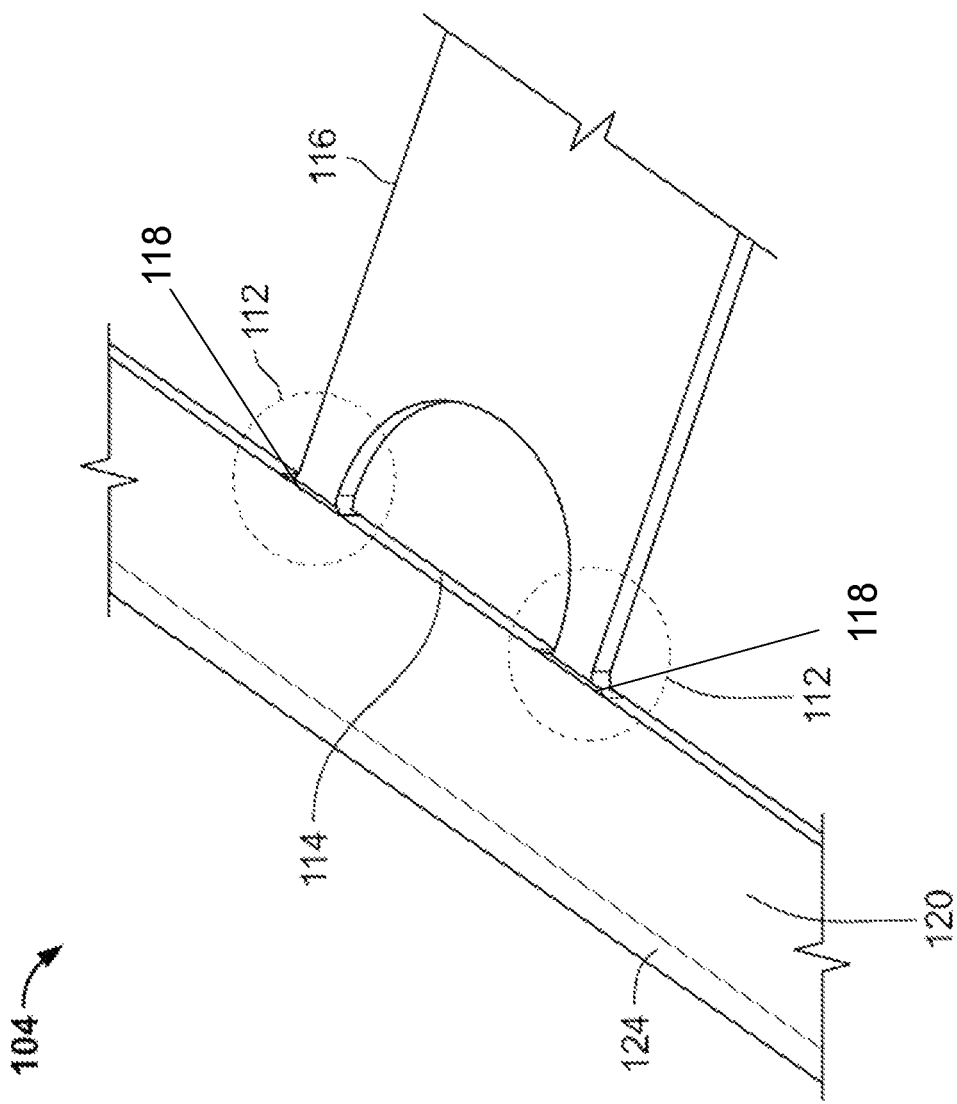
FIG. 6 is a perspective view of a portion of the BLS frame shown in FIG. 1, and showing two spaced apart connections or attachments including V-cuts between one of the arms and a corresponding portion along and/or adjacent a sidewall of the frame.
Figure 7:
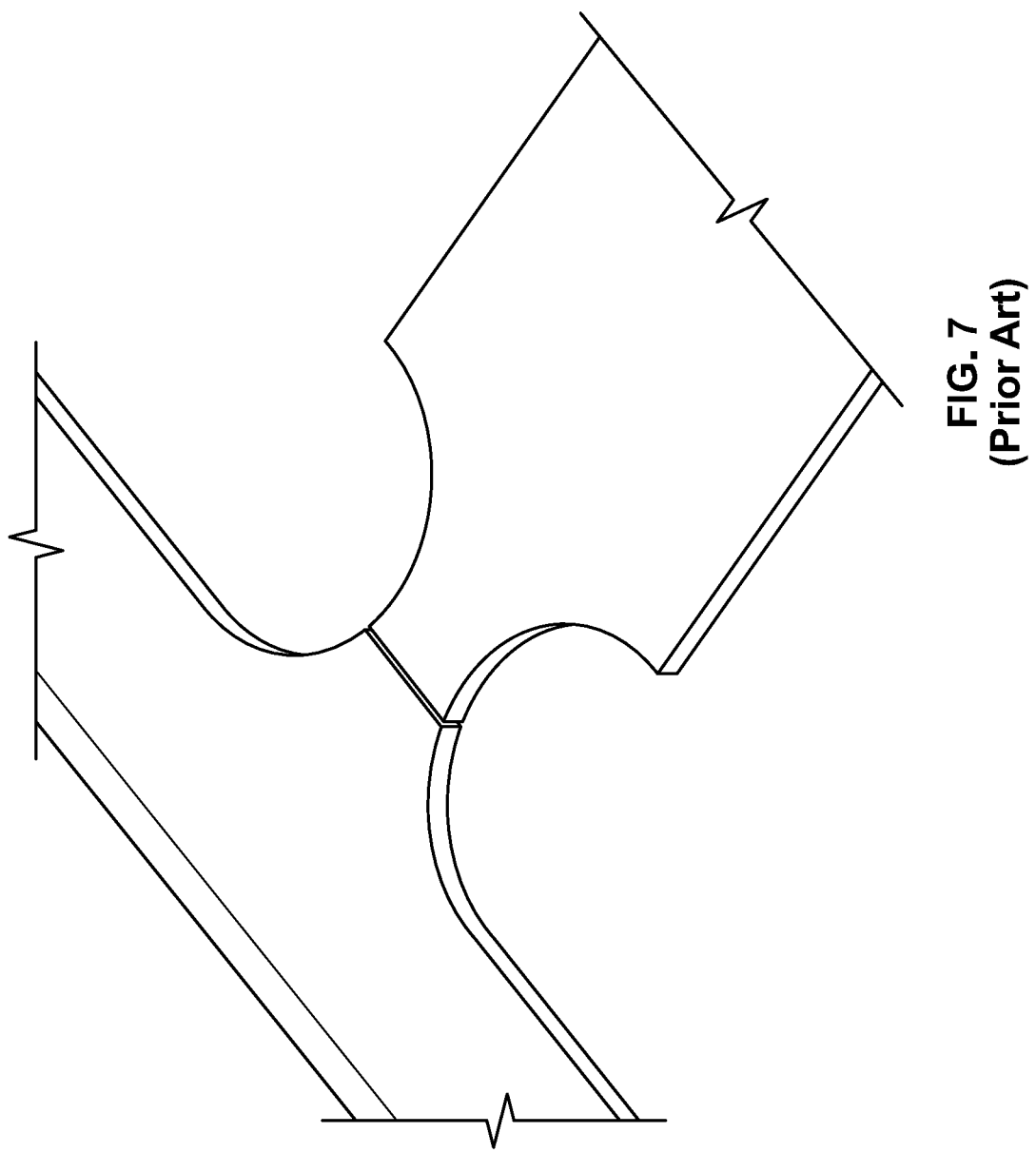
FIG. 7 illustrates an arm of a conventional BLS frame that has a single connection or attachment to a sidewall portion of the frame.

As shown in FIG. 6, at least two connections or attachments 112 are between each arm 116 of the bridge 108 and a corresponding portion 120 of the frame 104 along and/or adjacent sidewalls 124 of the frame 104. An opening 114 (e.g., a semicircular opening, etc.) is between the connections or attachments 112 along each arm 116. Accordingly, each arm 116 may be attached or connected to the corresponding portion 120 of the frame 104 via at least two spaced-apart connections or attachments 112 that are separated by an opening 114 therebetween.

The connections or attachments 112 may include V-cuts 118 (e.g., stamped with V-cuts, etc.) or otherwise configured to have a reduced thickness as compared to an initial thickness of the arm 116. In this illustrated embodiment, the connections or attachments 112 are provided (e.g., stamped, etc.) with V-cuts 118 configured to be readily and/or relatively easily severed (broadly, detached) to thereby allow the entire pick and place bridge 108 (including the bridge's arms 116 and pick and place island 128) to be readily removed from the frame 104, e.g., after SMT mounting of the frame 104 to a printed circuit board (PCB), etc.

The island 128 may be configured to allow the frame 104 to be picked up and carried by pick and place equipment (e.g., a gripper, a pneumatic head, a vacuum pick-and-place head, a suction cup pick-and-place head, etc.). By way of example, the island 128 may be generally circular and/or generally centrally located relative to the frame 104. The arms 116 may be configured to position the island 128 generally at about a center of mass of the frame 104, which, in turn, may allow for more balanced carrying of the frame 104 by pick and place equipment.

The arms 116 extend generally between the island 128 and corresponding portions 120 along and/or adjacent sidewalls 124 of the frame 104. In this example, the arms 116 extend from the island 128 to portions 120 of an eve, flange, rim, or lip of the frame 104 that extends inwardly from and/or along a perimeter defined by the frame's sidewalls 124. The eve may define an open top or opening 130 of the frame 104. The bridge 108 and the connections or attachments 112 may be generally parallel with the eve of the frame 104. Alternative embodiments may include a frame having a flangeless construction (e.g., without an inwardly extending eve, flange, rim, or lip, etc.) in which the V-cut connections or attachments are disposed between the bridge's arms and upper edge portions of the sidewalls of the frame.

As shown in FIGS. 1-4, each arm 116 includes an end portion having first and second connections or attachments 112 to a corresponding portion 120 of the frame 104. The attachments or connections 112 are separated and spaced apart from each other by the opening 114 (e.g., semicircular opening, etc.). The opening 114 has a closed shaped defined generally between the first and second connections or attachments 112, the portion 120 of the frame 104, and the end portion of the arm 116.

In this illustrated embodiment, the frame 104 includes five arms 116, specifically, a first arm 132, a second arm 136, a third arm 140, a fourth arm 144, and a fifth arm 148. The first and second arms 132, 136 extend from the pickup area or island 128 in generally opposite parallel directions towards opposite sidewalls of the frame 104. The third and fourth arms 140, 144 extend away from the pickup area or island 128 in a same generally parallel direction towards a front sidewall of the frame 104. The fifth arm 148 extends from the pickup area or island 128 in a generally opposite parallel direction than the third and fourth arms 140, 144 towards a back sidewall of the frame 104. Alternative embodiments may include more or less than five arms 116 and/or arms 116 having a different configuration (e.g., different location, different orientation, etc.).

As disclosed herein, the attachments or connections 112 between the arms 116 and the portions 120 of the frame 104 are configured to be readily and/or relatively easily severed (broadly, detached) to thereby allow the entire pick and place bridge 108 including the arms 116 and the pick and place island 128 to be readily removed from the frame 104. For example, the frame 104 may be carried via the pick and place bridge 108 and placed onto a substrate (e.g., PCB, etc.). The frame 104 may then be installed (e.g., soldered, attached via surface mount technology (SMT), etc.) to the substrate, etc. After the frame 104 has been installed (e.g., soldered, SMT processed, etc.) to the substrate, the connections or attachments 112 may be severed along their respective V-cuts 118 and the pick and place bridge 108 may be removed from (e.g., lifted off, etc.) the frame 104 while the frame 104 remains installed on the substrate.

FIG. 6 shows two spaced-apart connections or attachments 112 between one of the arms 116 and a portion 120 of the frame's eve. Also shown in FIG. 6 are V-cuts 118 across a width of each of the two attachments or connections 112. The V-cuts 118 may be formed by stamping or other suitable manufacturing process for removing material from the connections or attachments 112.

The opening 114 (e.g., a generally semicircular opening, etc.) between the two attachments or connections 112 may also be formed by stamping or other suitable manufacturing process for removing material from the arm 116. Due to the absence of the material that forms the opening 114, considerably less material is thereby used for the two attachments or connections 112. Because the two attachments or connections 112 include less material and reduced widths due to the presence of the opening 114 therebetween, the attachments or connections 112 may be more easily severed.

In addition, the V-cuts 118 across the width of each attachment or connection 116 reduce the material thickness of the attachments or connections 112 along the V-cuts 118. The reduced material thickness allows the attachments or connections 112 to be more easily severed.

The presence of the opening 114 and the V-cuts 118 may thus allow the attachments or connections 112 to be relatively easily severed along the V-cuts 118. By way of example, the attachments or connections 112 may be manually severed using conventional tweezers or other another suitable process (e.g., an automated process using pick and place equipment, etc.) without having to exert a large force that might otherwise distort the frame 104 and without requiring cutting, shearing, or clipping of the connections or attachments 112 between the bridge's arms 116 and the portions 120 of the frame 104. By way of further example, a relatively small force within a range from about 2 Newtons (N) to about 40 N may be sufficient for severing the V-cut attachments or connections 112 in an exemplary embodiment.

Advantageously, the bridge or pickup member 108 may be relatively easy to remove from the frame 104 without having to use to a special jig and without having to cut the connections or attachments 116 between the bridge 108 and the portions 120 of the frame 104. Despite the relative ease of severing the V-cuts 118, the connections or attachments 112 may be configured to be sufficiently strong and/or durable to withstand the process used to manufacture (e.g., stamping, folding, drawing, bending, integrally forming, etc.) the frame 104 and the bridge 108. The V-cuts 118 may also be configured (e.g., have a sufficient material thickness, etc.) to provide sufficiently secure connections (e.g., without looseness or instability issues, etc.) for the installation process (e.g., soldering, SMT process, etc.) used to install the frame 104 to a substrate (e.g., PCB, etc.).

By way of example only, the bridge 108 may have a material thickness within a range from about .05 millimeters (mm) to about .5 mm. For example, the frame 104 and bridge 108 may be integrally formed (e.g., stamped, folded, drawn, bent, etc.) from a single piece or blank of electrically-conductive material (e.g., stainless steel, etc.) having a thickness within a range of .05 mm to about .5 mm (e.g., a thickness of 0.5 mm, .5 mm, .1 mm, .2 mm, .3 mm, .4 mm, etc.). A width of each arm 116 may be within a range from about 1.5 mm to about 6 mm (e.g., 1.5 mm, 2 mm, 3 mm, 4 mm, 5 mm, 6 mm, etc.). Depending on the material thickness of the bridge 108, the material thickness along the V-cuts 118 may be within a range from about .05 mm to about .5 mm (e.g., .05 mm, less than .5 mm, etc.). The width of each V-cut 118 may be within a range from about 0.4 mm to about 1 mm (e.g., .4 mm, .5 mm, .6 mm, .7 mm, .8 mm, .9 mm, 1 mm, etc.). The dimensions provided herein are examples only as other exemplary embodiments may be configured differently, e.g., sized differently, etc.

The frame 104 may be formed from a single piece of electrically-conductive material (e.g., single blank of material, etc.) such that the frame 104, pickup member or bridge 108, and connections/attachments 112 have an integral, monolithic, single-piece construction. For example, a flat profile pattern for the frame 104, bridge 108, and connections/attachments 112 may be stamped into a piece of material, and then the frame's sidewalls 124 may be formed, bent, drawn, shaped, folded, etc. Even though the frame 104, bridge 108, and connections/attachments 112 may be integrally formed (e.g., stamping and then bending/folding/drawing, etc.) from the same piece of material substantially simultaneously in this example, such is not required for all embodiments.

The frame 104 may be configured for installation to a substrate (e.g., printed circuit board (PCB), etc.) generally about one or more components on the substrate such that the one or more components will be within an interior or shielding enclosure cooperatively defined by the frame 104 and a cover or lid that is attached to the frame 104. When the frame 104 is installed (e.g., soldered, etc.) on the substrate, the frame 104 and cover may be operable for shielding the one or more components that are within the interior or shielding enclosure cooperatively defined by the frame 104 and the cover.

A wide range of electrically-conductive materials may be used to form the frame 104 such as nickel plated aluminum alloy, tin plated aluminum alloy, cold rolled steel, nickel-silver alloys, copper-nickel alloys, stainless steel, tin-plated cold rolled steel, tin-plated copper alloys, carbon steel, brass, copper, aluminum, copper-beryllium alloys, phosphor bronze, steel, alloys thereof, a plastic material coated with electrically-conductive material, or any other suitable electrically-conductive and/or magnetic materials. The materials disclosed in this application are provided herein for purposes of illustration only as different materials may be used depending, for example, on the particular application In exemplary embodiments, the frame 104 may be made of a solderable material (e.g., 1/2 hard 770 Nickel Silver, stainless steel, other solderable material, etc.). The frame 104 may include a continuous, unbroken bottom edge. Alternatively, the frame 104 may include mounting feet along the lower edge portion of the frame 104. The mounting feet may be formed with castellations (e.g., formations with alternating notches and projections, etc.). The mounting feet may provide areas for soldering the frame 104 to PCB solder pads, etc. The notches or openings between adjacent pairs of the mounting feet may allow solder to flow around the mounting feet for securing the frame 104 to PCB solder pads. In other embodiments, the mounting feet may fit in corresponding openings in a substrate for securing the frame 104 to a substrate. In still further embodiments, a frame may not include any spaced-apart mounting feet along its lower edge portions. Instead, the frame may include sidewalls each having a generally continuous lower edge portion. In addition, alternative means besides soldering may also be employed for securing a shield to a substrate, such as adhesives, mechanical fasteners, etc.

In exemplary embodiments, a cover or lid may be provided that is releasably attachable to the frame 104 for covering the open top 130 of the frame 104. For example, the cover may include dimples configured to be engagingly received within openings or holes 152 (FIG. 5) along the frame's sidewalls 124. In this example, the lower surfaces of the cover's dimples may include or be operable as camming surfaces. As the cover is slidably moved downward relatively onto the frame 104, the camming surfaces may contact the portion 120 (e.g., eve or top edge) of the frame 104. This contact may then cause outward flexing of the cover's sidewall portions. The outward movement of the cover's sidewall portions may allow the cover's dimples to slide along the frame's sidewalls 124 until the cover's dimples are aligned with the holes 152 in the frame's sidewalls 124. The cover's sidewall portions may then resiliently move, flex, or snap back inwardly to thereby frictionally engage the cover's dimples within the frame's holes 152. Alternative embodiments may include other suitable means or attachment mechanisms for releasably attaching a cover or lid to a frame instead of or in addition to dimples and holes.

The cover or lid may also be detachable from and reattachable to the frame 104, such that the cover is reusable, e.g., after rework, etc. For example, after the frame 104 is soldered or otherwise installed onto a PCB, the bridge 108 may be removed and then a cover or lid may be releasably attached to the frame 104. If reworking and/or other PCB component access becomes necessary, the cover may be detached and removed from the frame 104 to allow reworking and PCB component access through the open top 130 of the frame 104 while the frame 104 remains installed onto the PCB. After the reworking and/or PCB component access is completed, the same cover may then be reused and reattached to the frame 104. The cover may be manually removable such as by using a tool (e.g., a plastic shim, etc.), etc. Additionally, or alternatively, the cover or lid may be configured to be removable via an at least partially automated process (e.g., without manual intervention, etc.), such as by using suitable pick and place equipment (e.g., a gripper, a pneumatic head, a vacuum pick-and-place head, a suction cup pick-and-place head, etc.).

The cover or lid may be formed from a single piece of electrically-conductive material (e.g., single blank of material, etc.) such that the cover has an integral, monolithic, single-piece construction. For example, a flat profile pattern for the cover may be stamped into a piece of material. The cover's sidewalls may then be formed, bent, drawn, shaped, folded, etc. Even though the cover may be integrally formed (e.g., stamping and bending/folding/drawing, etc.) from the same piece of material substantially simultaneously in this example, such is not required for all embodiments.

A wide range of electrically-conductive materials may be used to form a cover or lid disclosed herein such as nickel plated aluminum alloy, tin plated aluminum alloy, cold rolled steel, nickel-silver alloys, copper-nickel alloys, stainless steel, tin-plated cold rolled steel, tin-plated copper alloys, carbon steel, brass, copper, aluminum, copper-beryllium alloys, phosphor bronze, steel, alloys thereof, a plastic material coated with electrically-conductive material, or any other suitable electrically-conductive and/or magnetic materials. The materials disclosed in this application are provided herein for purposes of illustration only as different materials may be used depending, for example, on the particular application.

In exemplary embodiments, a thermal interface material may be applied to and/or used along with a board level shield (BLS) including a frame disclosed herein. For example, a thermal interface material may be applied along an inner and/or exterior surface of a BLS cover or lid that is attachable to the frame. Example thermal interface materials include thermal gap fillers, thermal phase change materials, thermally-conductive EMI absorbers or hybrid thermal/EMI absorbers, thermal greases, thermal pastes, thermal putties, dispensable thermal interface materials, thermal pads, etc.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An electromagnetic interference (EMI) shielding apparatus comprising:
    a frame including one or more sidewalls configured for installation to a substrate generally about one or more components on the substrate; and
    a pickup member including a pickup area and one or more arms each extending generally between the pickup area and a corresponding one of the one or more sidewalls of the frame, each said arm including an end portion connected to a corresponding portion of the frame by at least two connections spaced apart from each other with an opening therebetween defined by the end portion of the arm and the corresponding portion of the frame, each said connection includes a portion across a width of the connection that has a material thickness less than a material thickness of the corresponding arm and/or less than a material thickness of the corresponding portion of the frame;
    wherein each said connection includes a V-cut across the width of the portion of the connection that reduces the material thickness of the portion of the connection in a Z-direction and/or in a direction generally parallel with a height of the one or more sidewalls.

2. The EMI shielding apparatus of claim 1, wherein the frame has a flangeless construction in which each said connection is between the corresponding arm and upper edge portions of the sidewalls of the frame.

3. The EMI shielding apparatus of claim 1, wherein the end portion of the arm and the corresponding portion of the frame are configured such that the opening between the at least two connections has a closed perimeter shape.

4. The EMI shielding apparatus of claim 1, wherein the end portion of the arm and the corresponding portion of the frame are configured such that the opening between the at least two connections has a semicircular shape.

5. The EMI shielding apparatus of claim 1, wherein the at least two connections are configured to be severable from the frame to thereby allow for removal of the pickup member from the frame after the frame is installed on the substrate without distortion of the frame and with the frame remaining installed on the substrate without the pickup member.

6. The EMI shielding apparatus of claim 5, wherein the at least two connections are configured to be severable with a force within a range from about 2 Newtons to about 40 Newtons.

7. The EMI shielding apparatus of claim 1, wherein the one or more arms comprise:
    first and second arms extending from the pickup area in generally opposite parallel directions towards opposite left and right sidewalls of the frame;
    third and fourth arms extending away from the pickup area in a same generally parallel direction towards a front sidewall of the frame; and
    a fifth arm extending from the pickup area in a generally opposite parallel direction than the third and fourth arms towards a back sidewall of the frame.

8. The EMI shielding apparatus of claim 1, wherein the one or more arms are configured to support the pickup area relative to the one or more sidewalls of the frame such that the pickup area is generally centered relative to a center of mass of the frame.

9. The EMI shielding apparatus of claim 1, wherein:
    the pickup member is integrally formed with and fixedly attached to the frame; and
    the pickup area is configured to enable the pickup member and the frame to be picked up by pick-and-place equipment and placed on the substrate.

10. A board level shield comprising the EMI shielding apparatus of claim 1, and further comprising a cover releasably attachable to, detachable from, and reattachable to the frame, whereby the frame and the cover are operable for providing EMI shielding for the one or more components on the substrate that are within an interior cooperatively defined by the frame and the cover.

11. An electromagnetic interference (EMI) shielding apparatus comprising:
    a frame including one or more sidewalls configured for installation to a substrate generally about one or more components on the substrate; and
    a pickup member including a pickup area and one or more arms each extending generally between the pickup area and a corresponding one of the one or more sidewalls of the frame, each said arm including an end portion connected to a corresponding portion of the frame by at least two connections spaced apart from each other with an opening therebetween defined by the end portion of the arm and the corresponding portion of the frame, each said connection includes a portion across a width of the connection that has a material thickness less than a material thickness of the corresponding arm and/or less than a material thickness of the corresponding portion of the frame;
    wherein:
        the frame includes a rim that extends inwardly from and at least partially along a perimeter defined by the one or more sidewalls of the frame; and
        each said arm is connected to a corresponding portion of the rim by at least two of said connections.

12. An electromagnetic interference (EMI) shielding apparatus comprising:
    a frame including one or more sidewalls configured for installation to a substrate generally about one or more components on the substrate; and
    a pickup member including a pickup area and one or more arms each extending generally between the pickup area and a corresponding one of the one or more sidewalls of the frame, each said arm including an end portion connected to a corresponding portion of the frame by at least two connections spaced apart from each other with an opening therebetween defined by the end portion of the arm and the corresponding portion of the frame, each said connection includes a portion across a width of the connection that has a material thickness less than a material thickness of the corresponding arm and/or less than a material thickness of the corresponding portion of the frame;
    wherein:
        the frame includes a flange that extends inwardly from and at least partially along a perimeter defined by the one or more sidewalls of the frame; and
        each said arm is connected to a corresponding portion of the flange by at least two of said connections.

13. An electromagnetic interference (EMI) shielding apparatus comprising:

a frame including one or more sidewalls configured for installation to a substrate generally about one or more components on the substrate; and a pickup member including a pickup area and one or more arms each extending generally between the pickup area and a corresponding one of the one or more sidewalls of the frame, each said arm including an end portion connected to a corresponding portion of the frame by at least two connections spaced apart from each other with an opening therebetween defined by the end portion of the arm and the corresponding portion of the frame, each said connection includes a portion across a width of the connection that has a material thickness less than a material thickness of the corresponding arm and/or less than a material thickness of the corresponding portion of the frame;

wherein:
the frame includes a lip that extends inwardly from and at least partially along a perimeter defined by the one or more sidewalls of the frame; and
each said arm is connected to a corresponding portion of the lip by at least two of said connections.

14. An electromagnetic interference (EMI) shielding apparatus comprising:
a frame including one or more sidewalls configured for installation to a substrate generally about one or more components on the substrate; and
a pickup member including a pickup area and one or more arms each extending generally between the pickup area and a corresponding one of the one or more sidewalls of the frame, each said arm including an end portion connected to a corresponding portion of the frame by at least two connections spaced apart from each other with an opening therebetween defined by the end portion of the arm and the corresponding portion of the frame, each said connection includes a portion across a width of the connection that has a material thickness less than a material thickness of the corresponding arm and/or less than a material thickness of the corresponding portion of the frame;

wherein:
the frame includes an eve that extends inwardly from and at least partially along a perimeter defined by the one or more sidewalls of the frame; and
each said arm is connected to a corresponding portion of the eve by at least two of said connections.

15. An electromagnetic interference (EMI) shielding apparatus comprising:
a frame including one or more sidewalls configured for installation to a substrate generally about one or more components on the substrate; and
a pickup member including a pickup area and one or more arms each extending generally between the pickup area and a corresponding one of the one or more sidewalls of the frame, each said arm including an end portion connected to a corresponding portion of the frame by at least two connections spaced apart from each other with an opening therebetween defined by the end portion of the arm and the corresponding portion of the frame, each said connection includes a portion across a width of the connection that has a material thickness less than a material thickness of the corresponding arm and/or less than a material thickness of the corresponding portion of the frame;

wherein:
the frame includes an upper portion that extends inwardly from and at least partially along a perimeter defined by the one or more sidewalls of the frame; and
each said arm is connected to the upper portion of the frame by at least two of said connections.

16. The EMI shielding apparatus of claim 15, wherein each said connection includes a V-cut across the width of the portion of the connection that reduces the material thickness of the portion of the connection in a Z-direction and/or in a direction generally parallel with a height of the one or more sidewalls.

17. The EMI shielding apparatus of claim 15, wherein:
the upper portion of the frame defines an open top of the frame; and/or
the pickup member is generally parallel and co-planar with the upper portion of the frame.

18. A method comprising providing a frame including a pickup member and one or more sidewalls configured for installation to a substrate generally about one or more components on the substrate, the pickup member including a pickup area and one or more arms each extending generally between the pickup area and a corresponding one of the one or more sidewalls of the frame, each said arm including an end portion connected to a corresponding portion of the frame by at least two connections spaced apart from each other with an opening therebetween defined by the end portion of the arm and the corresponding portion of the frame, each said connection includes a portion across a width of the connection that has a material thickness less than a material thickness of the corresponding arm and/or less than a material thickness of the corresponding portion of the frame;

wherein the method includes removing material along the portion of each said connection across the width of the connection to thereby reduce the material thickness of the connection in a Z-direction generally parallel with a height of the one or more sidewalls; and wherein removing material along the portion of each said connection includes forming a V-cut along the portion of the connection that extends across the width of the connection to thereby reduce the material thickness of the connection in the Z-direction generally parallel with a height of the one or more sidewalls.

* * * * *